United States Patent [19]

Eddy

[11] Patent Number: 4,808,059

[45] Date of Patent: Feb. 28, 1989

[54] APPARATUS AND METHOD FOR TRANSFERRING WORKPIECES

[75] Inventor: William A. Eddy, Fremont, Calif.

[73] Assignee: Peak Systems, Inc., Fremont, Calif.

[21] Appl. No.: 886,296

[22] Filed: Jul. 15, 1986

[51] Int. Cl.[4] .............................................. B65H 5/08
[52] U.S. Cl. .................................... 414/416; 414/225;
414/283; 414/752; 414/744.4
[58] Field of Search ............... 414/416, 403, 404, 225, 414/282, 283, 627, 744 B, 752

[56] References Cited

U.S. PATENT DOCUMENTS

| | | | |
|---|---|---|---|
| 3,406,837 | 10/1968 | Kirsch et al. | 414/744 B |
| 3,823,836 | 7/1974 | Cheney et al. | 414/225 |
| 4,501,527 | 2/1985 | Jacoby et al. | 414/744 B X |
| 4,566,726 | 1/1986 | Correnti et al. | 414/752 X |
| 4,597,708 | 7/1986 | Wheeler et al. | 414/752 X |
| 4,648,786 | 3/1987 | Sakurai | 414/752 |

FOREIGN PATENT DOCUMENTS

2359763  6/1974  Fed. Rep. of Germany ...... 414/225

Primary Examiner—Peter R. Brown
Attorney, Agent, or Firm—Townsend and Townsend

[57] ABSTRACT

Apparatus and a method for transferring one or more workpieces from a first location to a second location in an automated fashion. The apparatus includes a wafer transfer arm having a vacuum means at one end thereof for removable attachment to the underside of a workpiece to cause the workpiece to be moved from a first location to a second location. The transfer arm is coupled at the opposite end thereof to a post which is coupled to drive means for moving the arm in three degrees of freedom, namely along an X direction, along a Z direction and in a rotative direction. A reversible drive motor is provided for each degree of freedom and the motors are mounted on a carriage in a manner such that the motors can be simultaneously actuated under the control of a computerized control means. Thus, with a program coupled to the control means, the transfer arm can be made to perform a series of steps sequentially to move one or more workpieces from a first location, such as a wafer cassette, to a processing station.

1 Claim, 4 Drawing Sheets

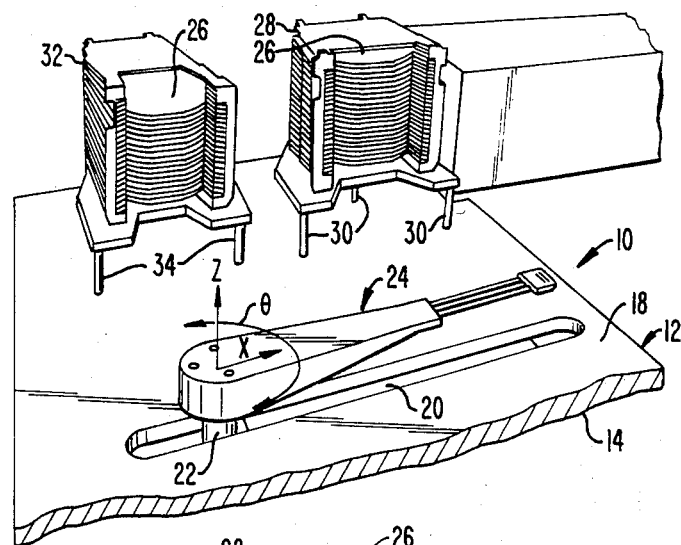
FIG._1a.
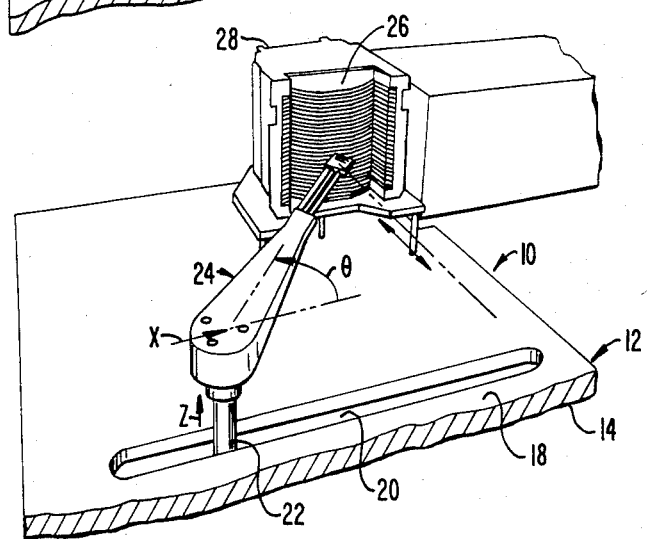
FIG._1b.
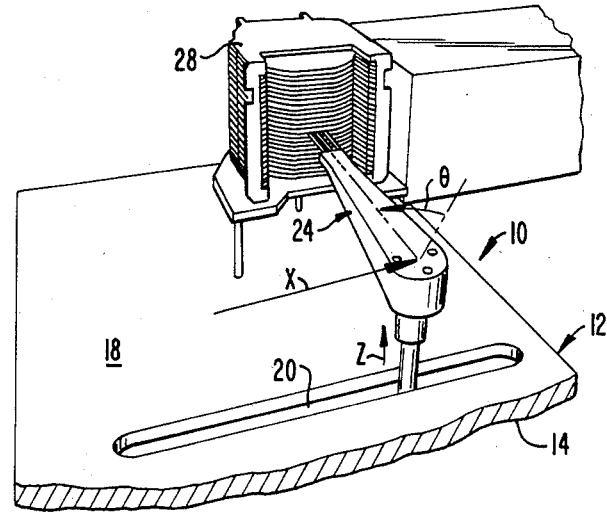
FIG._1c.

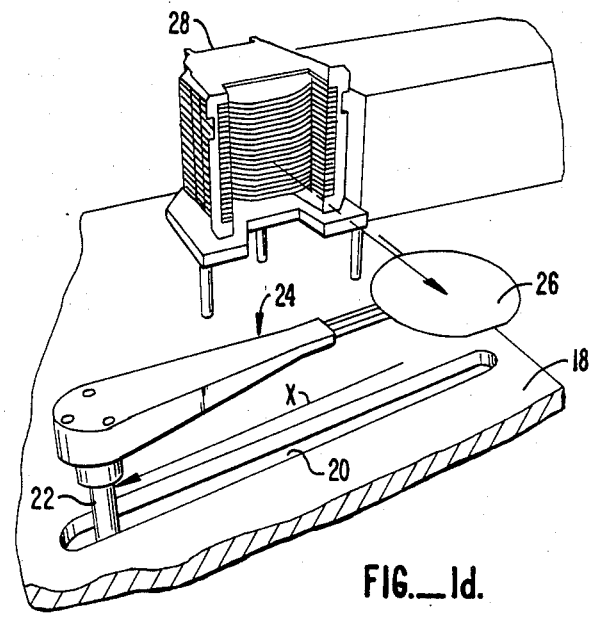
FIG._1d.
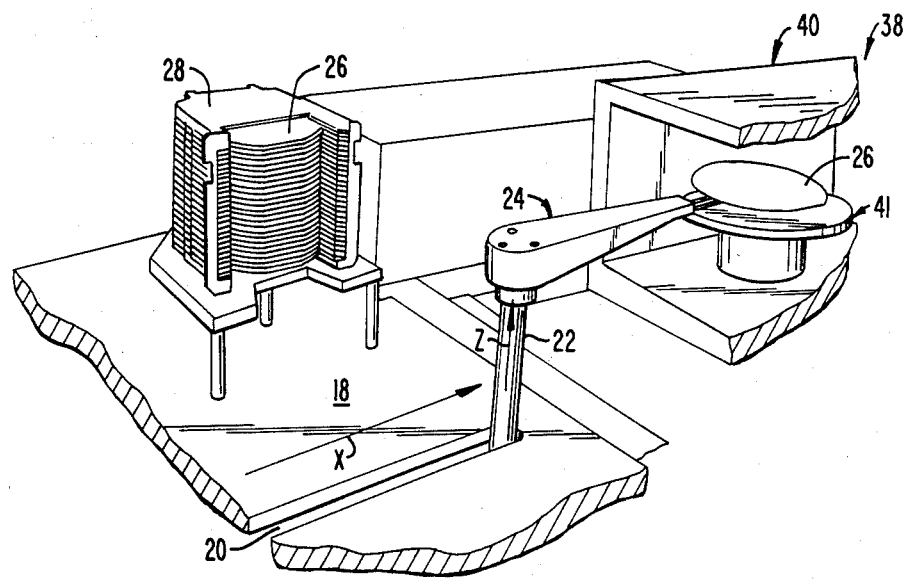
FIG._1e.
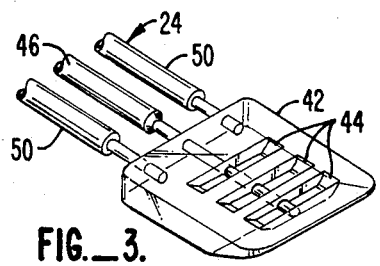
FIG._3.

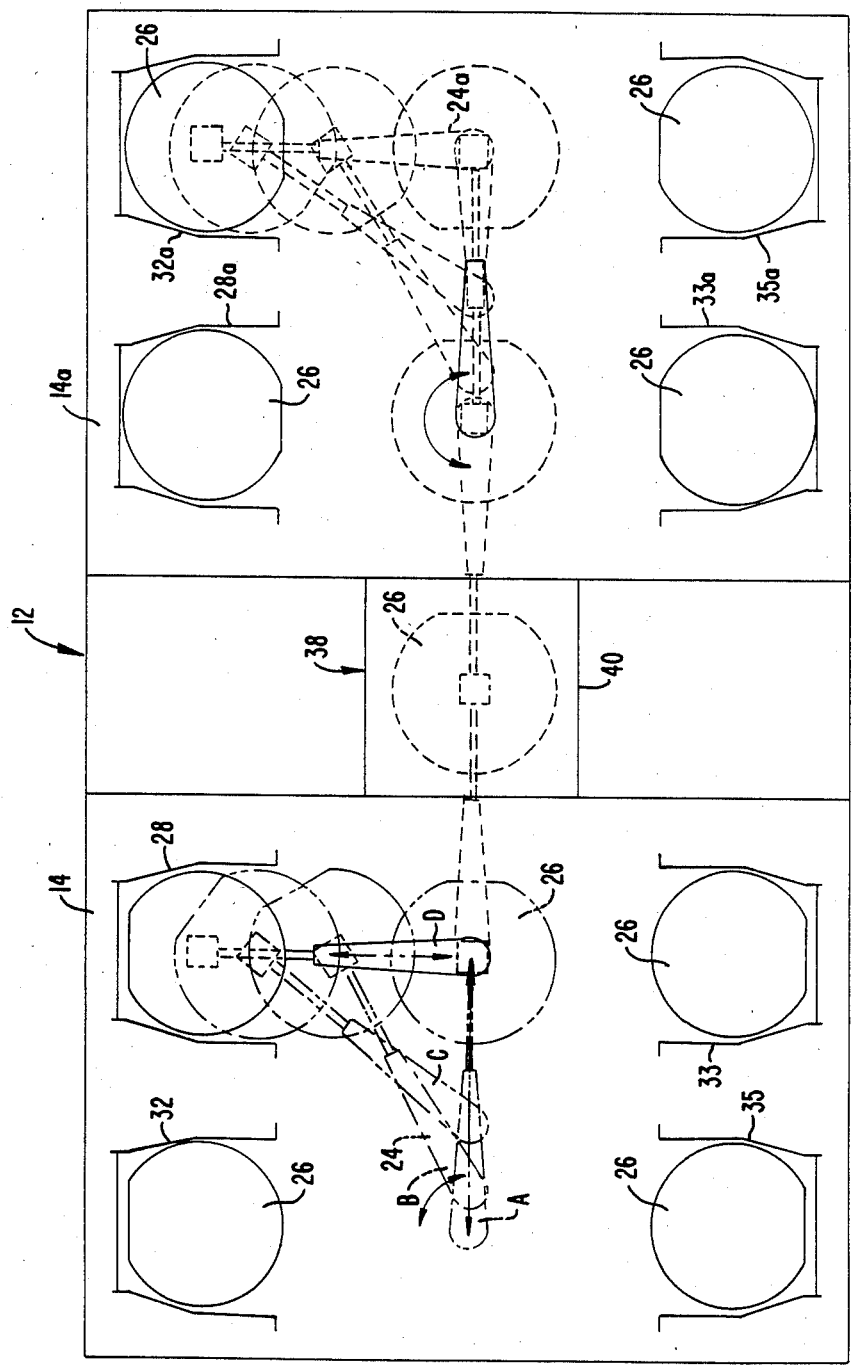
FIG._2.

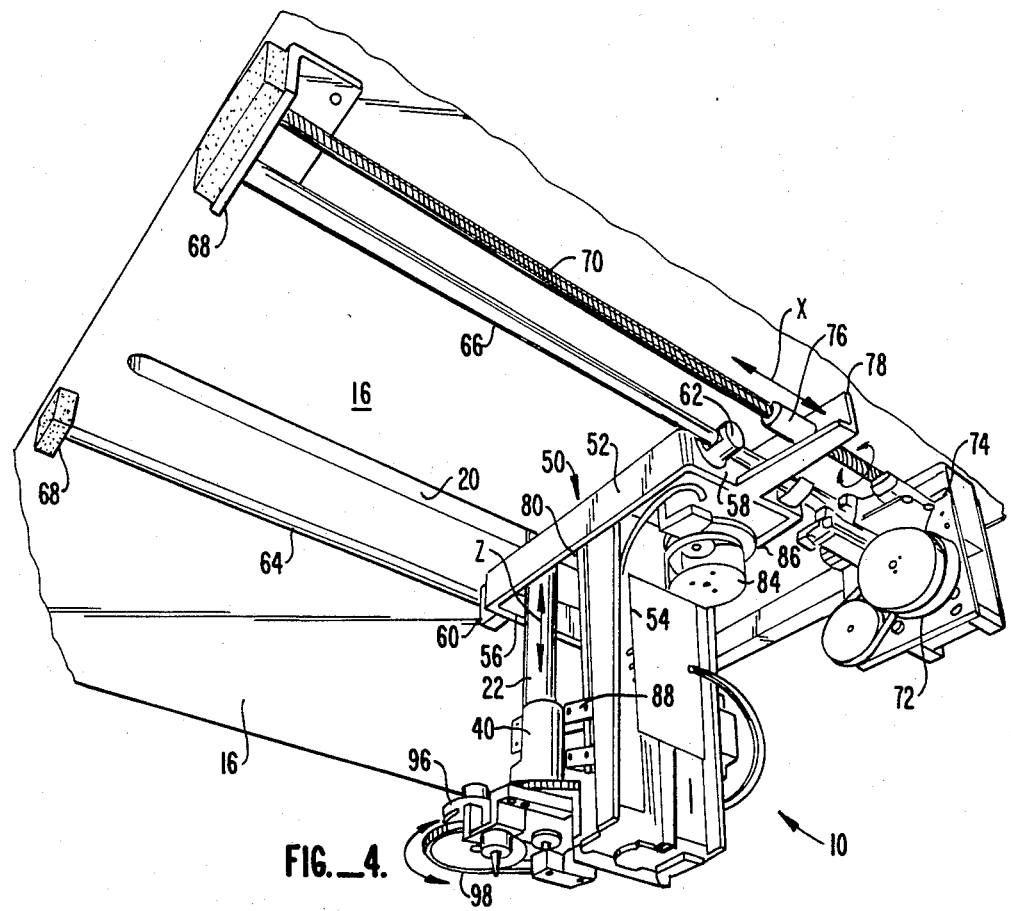
FIG._4.
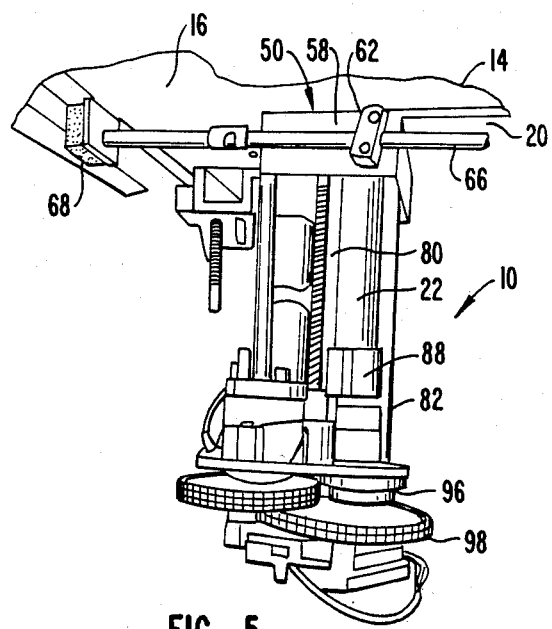
FIG._5.
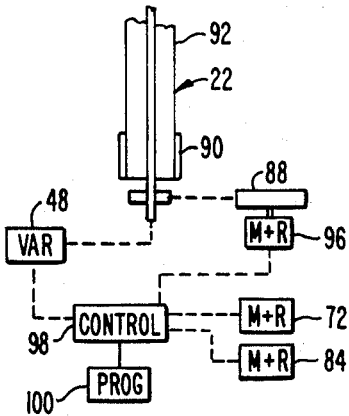
FIG._6.

APPARATUS AND METHOD FOR TRANSFERRING WORKPIECES

This invention relates to improvements in the processing of workpieces and, more particularly, to an apparatus and method for processing semiconductor wafers.

BACKGROUND OF THE INVENTION

In the processing of semiconductor wafers, it is important that the movement of the wafers from location to location be done as simply as possible and with a minimum of hardware. Many attempts have been made to move a plurality of wafers arranged in a stack in a cassette one by one out of the cassette to a processing station; however, such attempts have been generally cumbersome and complex in construction as well as requiring a relatively large number of operating steps to accomplish the transfer. In view of such drawbacks in conventional structures, a need exists for improvements in the transfer of a semiconductor wafer or a group of wafers from a first operative position to a second operative position. The present invention satisfies this need.

SUMMARY OF THE INVENTION

The present invention is directed to apparatus and a method for transferring a workpiece from a first location, such as a storage location in a cassette, to a second position, such as an operative location in a processing station. The invention also contemplates the transfer of a plurality of such workpieces one by one from the first location to the second location and further contemplates the removal of a workpiece or a group of workpieces from the second location to a first location or to a third location, all of which can be accomplished under the control of a computer-operated control means under the influence of a computer program. Thus, based upon the program, any number of different operative steps can be performed so that a wide range of operative sequences can be conducted reliably and without operator attention.

The primary object of the present invention is to provide an apparatus and method for handling one or more workpieces, such as semiconductor wafers, wherein each workpiece is moved from a first location to a second location by the performance of a series of simple sequences of steps to thereby minimize the complexity of such transfer and to obtain a highly reliable, high performance system which can be used in an automated production line without the need for operator attention except to supply workpieces to the system.

Other objects of this invention will become apparent as the following specification progresses, reference being had to the accompanying drawings for an illustration of the invention.

IN THE DRAWINGS

FIG. 1a is a fragmentary, perspective view of a wafer processing apparatus showing the upper portion of a wafer transfer mechanism which is the subject of the present invention, the mechanism having a movable arm in a first operative position with respect to a cassette containing a plurality of stacked semiconductor wafers to be transferred one by one to a wafer processing station forming another part of the apparatus;

FIGS. 1b, 1c, 1d and 1e are views similar to FIG. 1a but showing the sequence of movement of the wafer transfer arm as it removes a wafer from a wafer cassette and transfers it to the processing station;

FIG. 2 is a schematic, top plan view of the wafer processing apparatus showing the various operative positions of the transfer arm sequentially as it transfers a wafer from a cassette to the processing station, the view also showing a second wafer transfer arm on the opposite side of the processing station for placing a processed semiconductor wafer in a cassette;

FIG. 3 is a fragmentary, perspective view of the outer end of the wafer transfer arm, showing part of the vacuum means associated therewith for releasably coupling a wafer to the arm;

FIG. 4 is a perspective view of the wafer transfer mechanism looking upwardly from the bottom thereof with the mechanism being below the baseplate above which the wafer transfer arm of FIGS. 1a-1e moves with respect to a slot in the plate;

FIG. 5 is a fragmentary, perspective view of the mechanism looking in a direction approximately 180° from the location from which the mechanism is viewed in FIG. 4; and FIG. 6 is a schematic side elevational view of a portion of the wafer transfer mechanism of the present invention, showing the means by which the wafer transfer arm is rotated relative to a predetermined reference.

The wafer transfer mechanism of the present invention is broadly denoted by the numeral 10 and is adapted to form a part of a wafer processing apparatus (FIG. 2), such as an apparatus for placing a wafer in a processing station at which it is processed, such as being subjected to extremely high temperatures by the energization of a high performance, heat-emitting lamp. While the present invention is especially suitable for use in transferring semiconductor wafers, it can also be used to transfer other workpieces, such as substrates for use in the manufacture of wafers or other mechanical parts.

Transfer mechanism 10 includes a support 12 in the form of a horizontal baseplate 14 having a normally lowermost surface 16 and an upper flat surface 18 (FIGS. 1a-1e). Baseplate 14 has an elongated slot 20 therethrough to allow the passage of a post 22 therethrough, the post having at its upper end a wafer transfer arm 24 which is movable in three degrees of freedom relative to the baseplate 14. One end of the transfer arm 24 is coupled to the upper end of post 22 and the opposite end of the transfer arm 24 is adapted to become releasably attached to a semiconductor wafer 26 and transfer the wafer from a first location to a second location.

For purposes of illustration, the wafer 26 is removably placed within a wafer cassette 28 as shown in FIGS. 1a-1e, the cassette being mounted on legs 30 on the upper surface 18 of baseplate 14. Cassette 28 may be placed adjacent to a second cassette 32 also containing wafers 26 in a stack, the second cassette 32 being on legs 34 which place the lowermost wafer 26 at a position at which the wafer transfer arm 24 can conveniently be located with respect to the upper surface 18 of baseplate 14. The means for moving the wafer transfer arm 24 in its three degrees of freedom will be described in detail hereinafter. Such description will cover the structure for moving the transfer arm along a first rectilinear path in an X direction, i.e., in a direction parallel to slot 20, along a second rectilinear path in a Z direction, i.e., in a direction perpendicular to slot 20, and along an arcuate path in an angular direction in which the transfer arm rotates in a plane generally parallel with the plane of the upper surface 18 of baseplate 14.

FIG. 2 provides an overall top plan view in schematic form of apparatus 10 with which the wafer transfer mechanism 10 of the present invention is used. Apparatus 12 has means for mounting baseplate 14 thereon along with another baseplate 14a which is identical in size and construction with baseplate 14. Typically, baseplate 14 will be on one side of a processing station broadly denoted by the numeral 38 and containing a processing means 40 for processing a wafer 26. Baseplate 14a will be on the opposite side of the processing region 38 and will have a second wafer transfer arm 24a which operates in substantially the same manner as wafer transfer arm 24 associated with baseplate 14. The two wafer arms work in cooperation with each other, arm 24 being operable to transfer a wafer from a cassette 28 to an operative position within processing means 40; whereas, wafer transfer arm 24a is operable to remove the processed wafer 26 from processing means 40 and return it to a cassette 28a.

FIG. 2 also shows that, in addition to cassette 28 on one side of processing means 40, a second wafer containing cassette, such as anyone of cassettes 32, 33 and 35 can be carried on the upper surface of baseplate 14. Typically, only two cassettes at most will be used because of the rigidity and length of arm 24. For instance, cassettes 28 and 32 can be accomodated as well as cassette pair 33 and 35 and cassette pair 28 and 33. To access the wafers in an outer cassette, such as cassette 32 or cassette 35, the arm will have to rotate through 180° during part of the cycle in which a wafer is removed from the cassette. Baseplate 14a can support additional cassettes 32a, 33a and 35a, the latter cassettes being arranged on the opposite side of processing means to in a manner similar to the arrangement and use of cassettes 28, 32, 33 and 35 associated with baseplate 14. Transfer arm 24, by itself, can be used to take wafers out of a cassette and replace them in the same or different cassette.

FIGS. 1a–1e and FIG. 2 shown sequentially the movements of wafer transfer arm 24. In a "home" position, transfer arm 24 is in a first position identified by the letter A. A first movement of transfer arm 24 causes the arm to translate both in the X direction and in an angular direction so that the arm 24 moves into a position identified by B in FIG. 2. The angular movement occurs simultaneously with the rectilinear movement in the X direction which is a straight line direction from left to right when viewing FIG. 2. Continued movement of transfer arm 24 causes it to move into a position identified as C wherein the angular movement of the arm has continued simultaneously with the rectilinear movement in the X direction. Finally, the arm assumes a position identified as D in which the arm is substantially perpendicular to the position thereof when the arm was in position A. Moving through positions A, B, C and D, the arm progressively advances until its outer end extends into a cassette, such as cassette 28 and into a position beneath a wafer 26 in the cassette.

The outer end of the arm 24 has a pad 42 provided with vacuum pickup means thereon so that, when the pad is beneath a wafer 26, the wafer will be removably attached to pad 42 by suction. To this end, pad 42 has three recesses 44 which are in the upper surface of the pad and communicate with the interior of a tube 46 which passes back through arm 24 and downwardly through a tubular shaft 94 in post 22 to a vacuum source 48 (FIG. 6). Tube 46 projects outwardly from arm 24 along with a pair of support rods 50 which are on opposite sides of tube 46 as shown in FIGS. 1a–1e and FIG. 3. Pad 42 can move between a pair of vertically spaced wafers; thus, the present invention provides for the random accessing of wafers.

Mechanism 10 has, except for arm 24, all of its moving parts below base plate 14. Thus, it is possible to control particle distribution in and around the cassette or cassettes on the baseplate.

Mechanism 10 includes, in addition to post 22 and transfer arm 24, a plurality of components as shown in FIGS. 4 and 5. Such components include a carriage 50 comprised of a first, upper part 52 and a second part 54 rigid to the midpoint of part 52 and extending downwardly therefrom. Part 52 is frame-like in construction and has a pair of sides 56 and 58 provided with followers 60 and 62 which are in sliding engagement with respective, parallel rods 64 and 66 secured at their ends thereof to the underside of baseplate 14. The rods 64 and 66 are secured at their ends by blocks 68 to baseplate 14.

A first lead screw 70 extends parallel with and adjacent to rod 66, one end of lead screw 68 being journalled in adjacent mounting blocks 68 as shown in FIG. 4 and the opposite end of the lead screw is coupled to a reversible drive motor 72 carried on a platform 74 rigid to and extending downwardly from the lower face of base plate 14 as shown in FIG. 4. Lead screw 70 is threadably coupled with a sleeve 76 (FIG. 4) which is rigid to a lateral extension 78 secured to side 58 of upper part 52 of carriage 50. Thus, as motor 72 is energized, lead screw 70 is rotated relative to baseplate 14 and drives carriage 50 in a direction parallel with slot 20 or in the X direction. Since drive mtor 72 is reversible, carriage 50 can be moved in opposite direction relative to and along slot 20.

A second, vertical lead screw 80 (FIGS. 4 and 5) is journalled at its ends for rotation about a vertical axis. The lower bearing 82 (FIG. 5) for rotatably mounting screw 80 is rigidly secured in any suitable manner to part 54 of carriage 50. The upper bearing (not shown) for screw 80 is carried by part 52. A reversible drive motor 84 (FIG. 4) is carried in any suitable manner by carriage 50 and is coupled to the upper end of screw 80 by a chain and sprocket assembly 86 (FIG. 4).

Screw 80 is coupled by a link 88 (FIG. 4) to a sleeve 90 at the lower end of post 22, the sleeve Since the drive motor 96 is reversible, shaft 94 can be rotated in opposed directions so as to provide angular movement of arm 24 in either direction relative to baseplate 14.

Since sleeve 90 is coupled to the lower end of post 22, since sleeve 90 is coupled to screw 80, and since motor 96 is carried by sleeve 90, the sleeve and motor 96 raises and lowers with reference to the baseplate when motor 84 is energized. Thus, there must be a flexible cable between motor 96 and its source of electrical power.

A control means 98 (FIG. 6) is used to sequentially actuate motors 72, 84 and 96 and operate vacuum source 48. The control means 98 is computerized and is operated under the control and direction by a computer program denoted by the numeral 100. Thus, the operation of mechanism 10 can be programmed for any suitable sequential series of steps but, in general, the operation of the mechanism 10 will be as follows:

Upon actuation of control means 98, arm 24 will typically be in its home position A shown in FIG. 1a with the arm generally parallel with slot 20. Control means 98 will be under the influence and control of program 100.

The first step in the operation of mechanism 10 is to move the transfer arm in the Z direction to the proper location at which a wafer is to be removed from cassette 28. This Z movement of the transfer arm may be done independently of other movements or simultaneously with such other movements, such as movements in the X direction and angular movements caused by rotation of the transfer arm relative to the baseplate 14.

Control means 98 will also energize motor 72 to move post 22 and thereby the transfer arm 24 longitudinally of slot 20. FIG. 1b shows the displacement of the transfer arm 24 after it is moved a short distance in the X direction and after it has been rotated through an angle of approximately 45°. FIG. 1c shows the position of the wafer transfer arm after it is moved throughout a major portion of the length of slot 20 and has rotated through an angle of 90° from its home position shown in FIG. 1a. In such a position, the outer end of arm 24 has been inserted into cassette 28 beneath a wafer 26 to be removed from the cassette. Then, control means 98 causes motor 84 to be energized to slightly elevate the arm and causes vacuum means 48 to be actuated so that pad 42 will move into substantial engagement with the wafer 26 thereabove, causing the wafer to become removably attached to the pad for removal from the cassette.

FIG. 1d shows the wafer 26 fully removed from the cassette and the arm back to its home position, whereupon the motor 72 is energized along with motor 84 so as to advance the wafer 26 into processing station 40 while causing the wafer to be elevated slightly so that the wafer will be in proper position to be received on a wafer support 41 (FIG. 1e).

After the wafer has been deposited on support 41, the transfer arm is separated from the wafer by deactuating vacuum means 48 and reversing motors 72 and 84, whereby the transfer arm can return to its home position shown in FIG. 1a to await the next command to supply a wafer 26 to processing means 40. The aforesaid steps are repeated for each wafer 26 of cassette 28. The steps can be further repeated for each wafer in cassette 32 (FIG. 2) as well as each wafer in cassettes 33 and 35.

The wafer transfer mechanism 10 is also suitable for use with baseplate 14a wherein the mechanism is suitable for removing each processed wafer 26 from processing means 40. The steps recited above with respect to placing the wafer in processing means 40 can be reversed so that a plurality of wafers can be sequentially removed from processing means 40 and placed in the proper cassette 28a, 32a, 33a or 35a.

I claim:

1. In apparatus for handling a plurality of semiconductor wafers comprising:
   a horizontal baseplate having a rectilinear slot therethrough;
   a carriage;
   means shiftably mounting the carriage on the baseplate below the slot for movement along a horizontal path relative thereto;
   a post extending through the slot and having an upper and a lower end;
   a vertical lead screw journalled on the carriage and movable therewith along said horizontal path;
   means coupling the post to the vertical lead screw for movement of the post along a vertical path as a function of the rotation of the vertical lead screw;
   a horizontal screw journalled at its ends thereof on the baseplate on the lower surface thereof, there being means coupling the carriage to the horizontal lead screw for movement of the carriage in response to the rotation of the horizontal lead screw relative to the baseplate;
   a first reversible drive motor coupled with the horizontal lead screw for rotating the same to cause movement of the post along said horizontal path, said post having a shaft rotatably mounted therein and extending longitudinally thereof, there being a wafer transfer arm coupled to the upper end of the shaft for rotation therewith relative to the post;
   a second reversible drive motor carried by the post near the lower end thereof for rotating the shaft relative to the post and thereby rotating the transfer arm in a generally horizontal plane, said arm having an outer end provided with a wafer engageable pad, said pad, said arm and shaft having a fluid passage therethrough, there being vacuum means coupled with said fluid passage for reducing the air pressure therewithin to cause a suction force at the pad to thereby permit removable attachment of a wafer to the pad;
   a third drive motor coupled with the vertical lead screw for rotating the same; and
   control means coupled with said drive motors and said vacuum means for actuating the same in accordance with a predetermined sequence.

* * * * *